United States Patent [19]

Tamagaki

[11] Patent Number: 5,221,349
[45] Date of Patent: Jun. 22, 1993

[54] VACCUM ARC VAPOR DEPOSITION DEVICE

[75] Inventor: Hiroshi Tamagaki, Kobe, Japan

[73] Assignee: Kabushiki Kaisha Kobe Seiko Sho, Kobe, Japan

[21] Appl. No.: 866,428

[22] Filed: Apr. 10, 1992

[30] Foreign Application Priority Data

Apr. 10, 1991 [JP] Japan .................................. 3-77952

[51] Int. Cl.[5] .......................... C23C 14/28; C23C 14/32; C23C 14/54
[52] U.S. Cl. ..................................... 118/708; 118/712; 118/723; 204/298.41
[58] Field of Search .............. 118/723, 708, 712; 204/298.41

[56] References Cited

U.S. PATENT DOCUMENTS 4,512,867  4/1985  Andreev et al. ................. 118/723
4,662,312  5/1987  Aoki ................................. 118/688

FOREIGN PATENT DOCUMENTS 220618  4/1985  Fed. Rep. of Germany .

WO89/01699  2/1989  PCT Int'l Appl. .

OTHER PUBLICATIONS

Patent Abstracts of Japan, vol. 13, No. 575 (C-667), Dec. 19, 1989, & JP-A-240-645, Sep. 26, 1989, M. Yamashita, et al., "Vacuum Deposition Apparatus".

Primary Examiner—Richard Bueker
Attorney, Agent, or Firm—Oblon, Spivak, McClelland, Maier & Neustadt

[57] ABSTRACT

A vacuum arc vapor deposition device comprising an accumulation means for accumulating with time an electric power supplied to a vacuum arc evaporation source and an correcting means for correcting an arc current value so that an evaporation amount from the vacuum arc evaporation source is substantially constant in accordance with the increase of the electric power accumulated by the accumulating means.

The evaporation property due the consumption of the vacuum arc evaporation source can be corrected automatically and reproducibility between each of the processing lots can be obtained automatically without operators' aid.

16 Claims, 4 Drawing Sheets

F I G. 3(A)
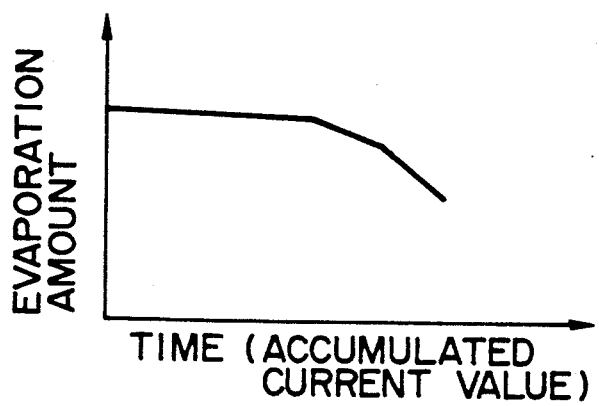
F I G. 3(B)
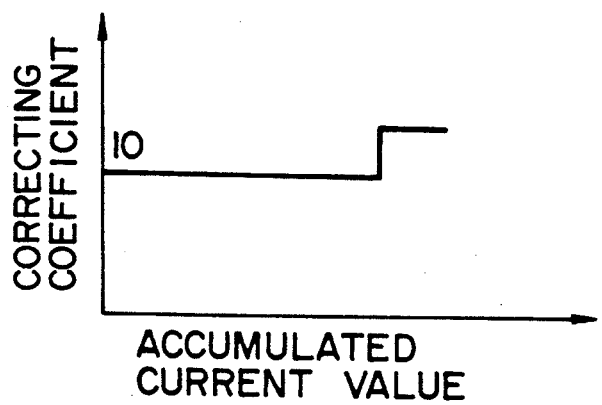
F I G. 3(C)
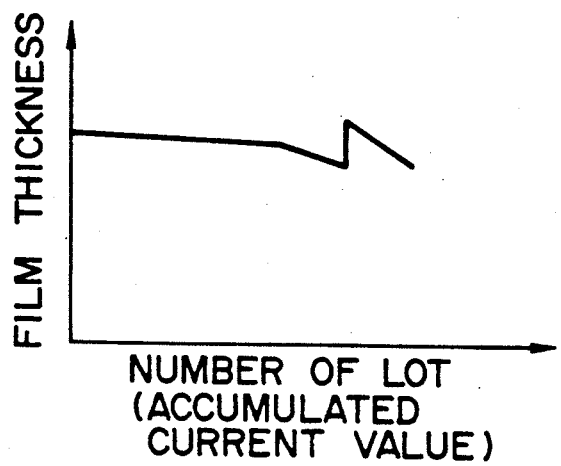

ly in the course of consumption of an evaporation material that constitutes the cathode (referred to as a target) to its life which is generally as much as several tens of lots. For instance, according to the results of an experiment conducted by the present inventor, when a target made of titanium initially having an outer shape of 100 mm × 16 mm thickness is consumed by about 50% (by weight) and approaches its life, the film-forming rate was reduced by about 15% as compared with the initial stage. Accordingly, in the course of processing several tens of lots, the film thickness during processing is reduced by 15% under constant film-forming conditions. Further, the change of the evaporation property gives an effect not only to the film thickness but also to the nature of the film formed.

VACCUM ARC VAPOR DEPOSITION DEVICE

BACKGROUND OF THE INVENTION

1. Field of the Invention

The present invention concerns a device for forming a film on a substrate in a vacuum and, more in particularly it relates to a vacuum arc vapor deposition device utilizing vacuum arc discharge for the evaporation of film materials.

2. Description of the Prior Art

The vacuum arc vapor deposition is a process of vaporizing a film material from an evaporation source (cathode) by vacuum cathodic arc discharge in a vacuum chamber and depositing it on a substrate. Atoms of the cathode material are emitted as a plasma beam at a high energy by a high arc current from the cathode as an evaporation source and accelerated, if necessary, by a negative voltage applied to the substrate, to form a film on the substrate.

One of the features of the vacuum arc vapor deposition process is a high ionizing ratio and high energy of the atoms of vaporized cathode material. Owing to this, a film with high density and excellent strength and durability can be obtained. Further, it has an industrially noted feature of high filmforming rate and excellent productivity.

Another feature of the vacuum arc vapor deposition process is that the film forming property is stable. That is, in the vacuum arc vapor deposition process, a constant amount of evaporation can be obtained in proportion to the current of vacuum arc discharge and, under predetermined processing conditions, the reproducibility upon repeating processing is extremely high. Therefore, in the vacuum arc vapor deposition process, control of the thickness of the film for example can be attained sufficiently by controlling a product of the arc discharging current supplied to an evaporation source and a discharge duration time. Furthermore, it has also been known to control the thickness of a film by a value obtained by accumulating with time an arc current supplied to the evaporation source (on the basis of unit, such as coulomb or A Hr).

However, even in the vacuum arc vapor deposition process with stable film property, change of property such as reduction of the film-forming rate appears, although gradually, in the course of consumption of an evaporation material that constitutes the cathode (referred to as a target) to its life which is generally as much as several tens of lots. For instance, according to the results of an experiment conducted by the present inventor, when a target made of titanium initially having an outer shape of 100 mm × 16 mm thickness is consumed by about 50% (by weight) and approaches its life, the film-forming rate was reduced by about 15% as compared with the initial stage. Accordingly, in the course of processing several tens of lots, the film thickness during processing is reduced by 15% under constant film-forming conditions. Further, the change of the evaporation property gives an effect not only to the film thickness but also to the nature of the film formed.

In the existing batchwise processing devices, if the change of the film thickness is within an allowable range, correction has been scarcely applied as a countermeasure for the fluctuation of the evaporation property. If the correction is necessary, an operator partially changes processing conditions considering the degree of the consumption of the cathode or by judgment in view of experience based on the number of lots processed. Further, as another method, the film thickness of processing products has been periodically monitored and fedback to processing conditions.

The above-mentioned situations are the same also in a device capable of automatic operation and, in a case where the change of the evaporation property due to the consumption of the cathode gives rise to a problem, a plurality of processing conditions are previously provided and they are applied switchingly by an operator in accordance with the consumption of the cathode.

Naturally, change of the evaporation property which changes the film property is not desirable but, in a case where an operator switchingly applies the processing conditions for correcting such a change, it brings about such a problem that a manual error or individual difference among operators is liable to occur.

Further, in a continuous type device for mass-processing such as a highly automated vacuum arc vapor deposition device, the problem becomes more severe. That is, such a device has an independent vacuum exhaustion chamber, a vapor deposition chamber and an atmosphere releasing chamber, and can process several tens of lots per day, during which processing is applied without operators' aid. In such a case, since necessary correction for the processing conditions can not be conducted, scattering of film thickness may be caused between each of the processing lots.

OBJECT OF THE INVENTION

An object of the present invention is to provide a vacuum arc vapor deposition device capable of automatically correcting the change of the evaporation property due to the consumption of a vacuum arc evaporation source and capable of automatically attaining reproducibility, between each of processing lots without operators' aid, thereby enabling automatic operation.

SUMMARY OF THE INVENTION

The foregoing object of the present invention can be attained by a vacuum arc vapor deposition device comprising means for accumulating with time an arc discharge current supplied to a vacuum arc evaporation source, and means for correcting an arc discharge current such that the evaporation amount from the vacuum arc evaporation source is made substantially constant in accordance with the increase of the supplied arc current accumulated by the accumulating means.

The foregoing object of the present invention can be further attained by a vacuum arc vapor deposition device comprising means for accumulating with time an electric power supplied to a vacuum arc evaporation source and means for correcting an arc current value so that an evaporation amount from the vacuum arc evaporation source is made substantially constant in accordance with the increase of the supplied electric power accumulated by said accumulating means.

In accordance with the present invention, an arc discharge current value of a vacuum arc evaporation source is read and accumulated with time by an accumulating means. Then, in accordance with the increase of the accumulated current value, the arc discharge current is corrected by a correcting means to maintain the evaporation amount from the vacuum arc evaporation source substantially constant. Accordingly, since the change of the evaporation property due to the consumption of the vacuum arc evaporation source can be corrected automatically and the reproducibility between each of the processing lots can be obtained automatically without operators' aid, automatic operation is enabled.

DESCRIPTION OF THE ACCOMPANYING DRAWINGS

DESCRIPTION OF THE PREFERRED EMBODIMENTS

Figure 1:
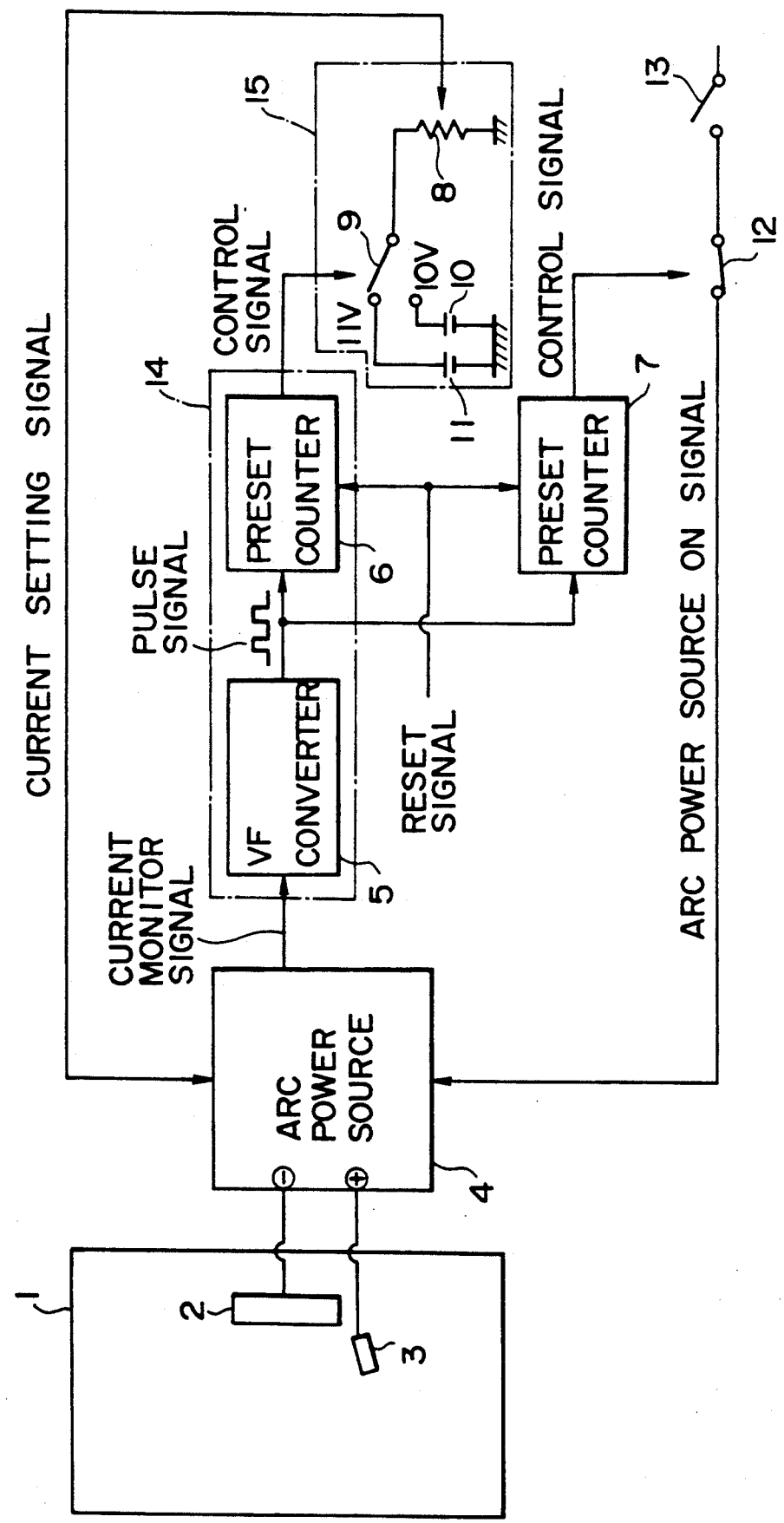
FIG. 1 is a block diagram illustrating a first embodiment of the present invention.

FIG. 1 shows a block diagram of a control circuit in the first embodiment according to the present invention. In FIG. 1, only the matters necessary for the explanation of the present invention are shown and others not necessary in view of the explanation are omitted even when they are actually necessary as a control device in the vacuum arc vapor deposition device.

In the vacuum arc vapor deposition device, a cathode comprising an evaporation material (target) 2 and an anode 3 are disposed in a vacuum chamber 1, to which an electric power is supplied from an arc power source 4, to generate arc discharge and vaporize the target, to form a film on a substrate. From the arc power source 4, an arc discharge current is output as a current monitor signal that can be monitored (a voltage signal in proportion with the current in this embodiment).

The current monitor signal is received by a control device and converted into a pulse signal by a V/F converter 5. Since the number of pulses per unit time of the pulse signal is in proportion with the arc discharge current value, as the number of pulses is accumulated, the accumulated value is in proportion with the accumulated value of the arc discharge current with time. Accordingly, if the pulse accumulated value is multiplied with an appropriate constant, it can be converted into a time-accumulated value of the arc discharge current.

In this embodiment, two preset counters 6, 7 are used for the accumulation of the number of pulses. Each of the counters 6, 7 can be inputted with a reset signal for the counted value, and when the consumed part of the cathode (target) is and replaced with a new one, it is possible to reset the accumulated pulse value, that is, the time-accumulated value of the arc discharge current is reset to zero.

A setting value to the first preset counter 6 is determined as a value corresponding to the accumulated arc current value at which the target consumption is advanced and the evaporation amount is reduced, for example, by 10% of the initial stage. When the accumulated value in the first preset counter 6 reaches the setting value, the first preset counter 6 generates a control signal to switch the voltage supplied to a current setting variable resistor 8 for setting the arc current from a 10 V power source 10 to an 11 V power source 11 by a switch 9. That is, the arc power source 4 controls its current output while receiving a voltage signal (current setting signal) from the control device, and the voltage signal is controlled by the operators' manipulation of the current setting variable resistor 8. When the voltage supplied to the current setting variable resistor 8 is increased by, for example, 10% by the operation of the first preset counter 6, the current setting signal can be increased by 10% without changing the setting of the current setting variable resistor 8. Accordingly, since the arc discharge current value is increased and the reduction of the target evaporation amount can be corrected, the evaporation amount can be maintained substantially constant.

In this embodiment, only one counter is used for correcting the evaporation amount, but it is of course possible to change-over the correction values finely over a number of steps by using a plurality of counters.

The second preset counter 7 functions in another way. That is, a value corresponding to the life of the target is set to the second preset counter as a setting value. When the accumulated value in the second preset counter 7 reaches the setting value by which the life of the target is detected, the second preset counter 7 generates a control signal to turn the switch 12 to OFF. Accordingly, although the power source switch 13 is kept ON as it is, ON signal sent from the control device to the arc power source 4 is automatically disconnected to interrupt the use of the target beyond its life. Accordingly, an deterioration in performance caused by excessive use of the target can be prevented.

As has been described above, in this embodiment, change of the evaporation property due to the consumption of the target can be corrected automatically and, if the target is consumed to its full life, it is also possible to automatically interrupt the arc discharge.

The accumulating means 14 is constituted by V/F converter 5 and the first preset counter 6, while the correcting means 15 is constituted by the variable resistor 8, the switch 9 and the power sources 10, 11.

The embodiment described above shows a fundamental constitution applicable to such a device that the vapor deposition operation is conducted manually. In a device in which the vapor deposition operation itself is completely automated by utilizing a computer or the like, since the present invention can be realized on a computer algorithm, application to a higher level is possible and the effect is improved.

Description will now be made of a case in which the present invention is applied, as a second embodiment, to a device in which such a computer control is adopted. Also in FIG. 2, only the constituents necessary for the explanation of the present invention are shown among those of the control system.

Figure 2:
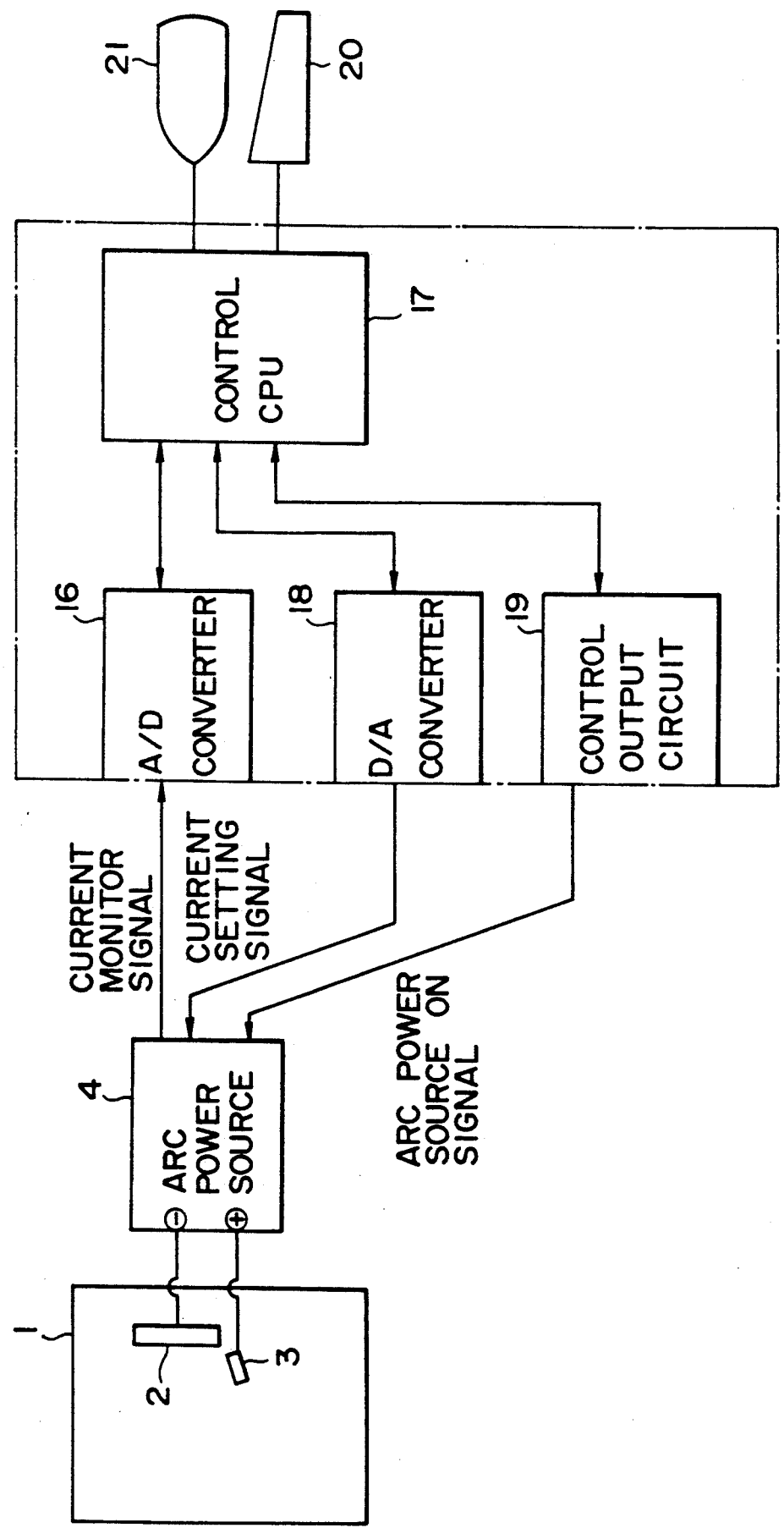
FIG. 2 is a block diagram illustrating a second embodiment of the present invention.

In FIG. 2, a current monitor signal from an arc power source 4 is read as information digitized by an A/D converter 16 into a controlling CPU 17, while a current setting signal and an arc power source ON signal are, respectively, sent from a controlling CPU 17 by way of a D/A converter 18 and a control output circuit 19 to an arc power source 4 respectively. In the device having such a control system, a change with time of film-forming conditions such as an arc current during one cycle are previously inputted, typically, from a key board 20 or the like as a program and vapor deposition operation of repeatingly operating the same is conducted in FIG. 2 numeral 21 denotes a CRT.

In a case of practicing the present invention by the device having such a control system, the following contents are added as a control program to a usual control program.

(1) A program of accumulating current information of the arc power source 4 time numerically on every predetermined interval, and determining the accumulated arc current value during the target life of the vacuum arc evaporation source. The accumulated arc current value can be changed, for example, upon exchange of the target, by manipulation from the key board 20 or the like.

(2) Data previously inputted from the key board 20 or the like for corresponding the accumulated arc current value to a required correcting amount of the arc discharge current.

(3) A program for correcting the current setting signal sent to the arc power source 4 based on the accumulated arc current value and the data of correcting amount.

Figure 3D:
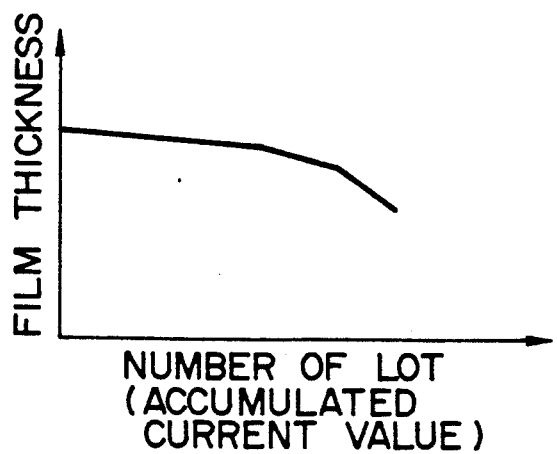
FIG. 3 is a waveform chart in the second embodiment of the present invention.

In a case of using an evaporation source in the constitution described above whose evaporation amount varies with lapse of the discharge time, for example, as shown in FIG. 3(A), the arc current value can be corrected by the accumulated value of the arc discharge current by using the data for the correcting amount as shown in FIG. 3(B). Accordingly, scattering of the film thickness between each of the processing lots can be reduced to such an extent as shown in FIG. 3(C) and processing with less scattering as compared with the existent case shown in FIG. 3(D) is possible.

Figure 3E:
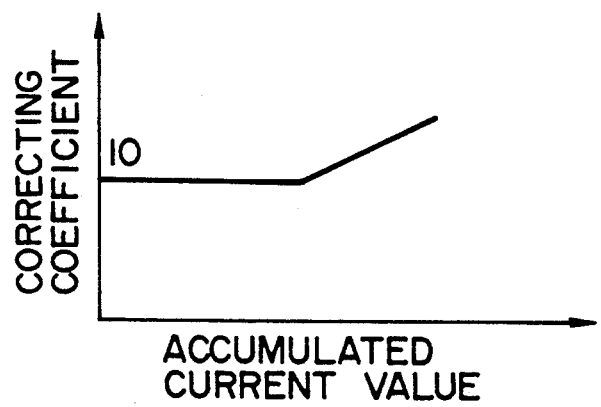
Figure 3F:
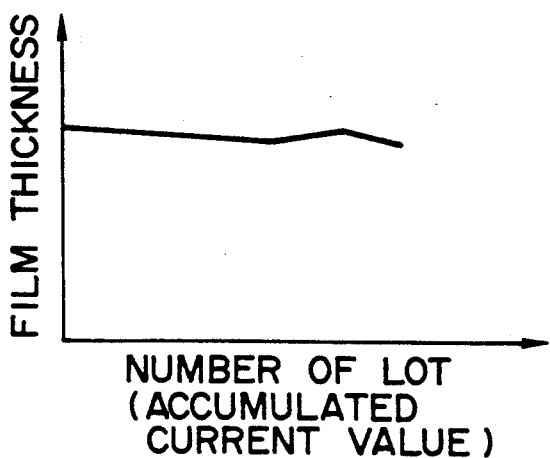

As the data for the correcting amount, not only the stepwise data as shown in FIG. 3(B) but also a continuous correcting data as shown in FIG. 3(E) can also be used. In this case, a result with less scattering can be obtained as shown in FIG. 3(F).

When control is applied by using the accumulated arc current value calculated in accordance with the present invention, not only the uniformity of the film thickness but also the following effect of improving the performance of the vapor deposition device can be obtained.

That is, when the accumulated arc current value corresponding to the target's life is previously determined and processing is interrupted at a stage in which the target reaches its life as shown already in the first embodiment, it can provide an effect of preventing deterioration of the device. Further, it is also preferred in view of improving the working efficiency of the device to issue an alarm at a stage where it reaches accumulated values corresponding to, for example, 80% and 90% of the target life.

Further, in the vacuum arc evaporation source, a magnetic field is sometimes applied to the evaporation surface of a target with an aim of improving the utilization efficiency of the target, and the optimum strength or the shape of the magnetic field is generally changed depending on the state of consumption of the target. For instance, in a case of using magnet coils disposed at the back of the target as a means for applying the magnetic field the distance between the retracted evaporation surface and the coil is shortened, if the target is consumed, to excessively increase the magnetic field intensity on the evaporation surface as compared with that in the initial stage. In the third embodiment, the magnetic field on the target evaporation surface can be kept properly in such a case by recognizing the state of consumption by the accumulated value of the arc current and reducing the exciting current for the coils. Further, in a case where the optimum shape of the magnetic field changes due to the consumption of the target, a plurality of magnetic coils can be disposed at the back of the target and exciting coils can be switched depending on the accumulated arc current value.

In the foregoing descriptions, the monitor signal of the arc current is processed to calculate the accumulated value of the arc current, but the invention is not restricted only thereto. For instance, it is also possible to determine a value corresponding to the accumulated arc current value by using the setting value for the arc current and conducting the same control, although it may be somewhat poor in terms of accuracy. Further, it is essentially in the scope of the present invention to accumulate the electric power supplied to the vacuum arc evaporation source, which is used in place of the accumulated current value, by utilizing the property of the vacuum arc discharge that the arc discharge voltage is made substantially constant.

Since the present invention comprises an accumulating means for accumulating with time an arc discharge current value of a vacuum arc evaporation source, and a correcting means for correcting the arc discharge current so that the evaporation amount from the vacuum arc evaporation source is made substantially constant in accordance with the increase of the accumulated current value accumulated by the accumulating means, the evaporation property due to the consumption of the vacuum arc evaporation source can be corrected automatically and reproducibility between each of processing lots can be obtained automatically without operators' aid.

What is claimed is:

1. A vacuum arc vapor deposition device comprising:
    means for accumulating with time an arc discharge current value of a vacuum arc evaporation source and
    means for correcting said arc discharge current value so that an evaporation amount from the vacuum arc evaporation source is made substantially constant in accordance with an increase in the accumulated arc discharge current value accumulated by said accumulating means.

2. A vacuum arc vapor deposition device as defined in claim 1, wherein the arc discharge current value is output from said vacuum arc evaporation source as a current monitor signal that can be monitored.

3. A vacuum arc vapor deposition device as defined in claim 2, wherein said means for accumulating with time the arc discharge current value from the vacuum arc evaporation source comprises a V/F converter for converting the current monitor signal from the vacuum arc evaporation source into a pulse signal, and a preset counter for counting said pulse signal.

4. A vacuum arc vapor deposition device as defined in claim 1, wherein said means for correcting the arc discharge current value comprises a current setting variable resistor for setting the arc discharge current value, a plurality of power sources for outputting current setting signals to the vacuum arc evaporation source and a switch for switching said plurality of power sources.

5. A vacuum arc vapor deposition device as defined in claim 3, wherein the preset counter generates a control signal when the accumulated value of said preset counter reaches a setting value, to switch a voltage supplied to the current setting variable resistor to thereby change the value of said arc discharge current.

6. A vacuum arc vapor deposition device as defined in claim 1, further comprising means for generating a control signal when the accumulated value of the arc discharge current value reaches a set value corresponding to the life of a target, in order to thereby turn off the vacuum arc evaporation source.

7. A vacuum arc vapor deposition device as defined in claim 6, wherein said means for turning off the vacuum arc evaporation source is adapted to generate an alarm signal when the accumulated arc discharge current value reaches a set value smaller than that corresponding to the life of the target.

8. A vacuum arc vapor deposition device as defined in claims 6 or 7, wherein said means for turning off the vacuum arc evaporation source comprises a preset counter.

9. A vacuum arc vapor deposition device as defined in claim 2, wherein said current monitor signal from the vacuum arc evaporation source is read into a controlling CPU as information digitized by an A/D convertor.

10. A vacuum arc vapor deposition device as defined in claim 9, wherein said means for accumulating with time an arc discharge current value of said vacuum arc evaporation source comprises a program for accumulating current value information about digitized arc discharge current values for each period of time within a CPU.

11. A vacuum arc vapor deposition device as defined in claim 10, wherein said means for correcting said arc discharge current value comprises a program for calculating, within a CPU, a necessary corrected amount of arc discharge current from the accumulated value of said arc discharge current value based on data of the accumulated arc discharge current value and a corresponding corrected amount thereof.

12. A vacuum arc vapor deposition device as defined in claim 1, comprising means for applying an electromagnetic field to an evaporation surface of a target.

13. A vacuum arc vapor deposition device as defined in claim 12, which is adapted to store values corresponding to a consumption state of a target based on the accumulated value of said arc discharge current value, to thereby control the electromagnetic field applied to the target evaporation surface.

14. A vacuum arc vapor deposition device as defined in claim 12, wherein said means for applying the electromagnetic field to the target evaporation surface comprises a magnetic coil disposed at a back surface of the target.

15. A vacuum arc vapor deposition device as defined in claim 13, wherein a plurality of magnetic coils are disposed at a back surface of the target such that the coils which are energized can be alternately switched depending on the accumulated value of said arc discharge current value.

16. A vacuum arc vapor deposition device comprising:
    means for accumulating with time an electric power supplied to a vacuum arc evaporation source; and
    means for correcting an arc current value so that an evaporation amount from the vacuum arc evaporation source is made substantially constant in accordance with an increase in the supplied electric power accumulated by said accumulating means.

* * * * *